(12) United States Patent
Kim

(10) Patent No.: US 7,632,692 B2
(45) Date of Patent: Dec. 15, 2009

(54) LIQUID CRYSTAL DISPLAY, THIN FILM TRANSISTOR ARRAY PANEL THEREFOR, AND MANUFACTURING METHOD THEREOF

(75) Inventor: Dong-Gyu Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 103 days.

(21) Appl. No.: 11/716,461

(22) Filed: Mar. 8, 2007

(65) Prior Publication Data
US 2007/0164286 A1    Jul. 19, 2007

Related U.S. Application Data

(62) Division of application No. 10/815,788, filed on Apr. 2, 2004, now Pat. No. 7,202,498.

(30) Foreign Application Priority Data
Apr. 4, 2003    (KR)    ............... 2003-0021311

(51) Int. Cl.
    *H01L 21/00* (2006.01)
(52) U.S. Cl. .............. 438/24; 438/30; 438/48; 438/128; 257/E27.142
(58) Field of Classification Search ............ 438/30, 438/48, 128, 149, 151, 161, 24
    See application file for complete search history.

(56) References Cited

U.S. PATENT DOCUMENTS

| 6,225,212 | B1 * | 5/2001 | Liu et al. ............... 438/625 |
| 6,429,916 | B1 | 8/2002 | Nakata et al. |
| 6,466,281 | B1 | 10/2002 | Huang et al. |
| 6,503,772 | B1 | 1/2003 | Ohtsu et al. |
| 6,759,281 | B1 * | 7/2004 | Kim et al. ............... 438/149 |
| 6,784,457 | B2 | 8/2004 | Yamazaki et al. |
| 6,784,965 | B2 | 8/2004 | Kim et al. |
| 2002/0151097 | A1 * | 10/2002 | Wong ............... 438/48 |
| 2002/0182766 | A1 * | 12/2002 | Yamamoto ............... 438/30 |
| 2003/0013236 | A1 * | 1/2003 | Nakata et al. ............... 438/149 |
| 2006/0050192 | A1 | 3/2006 | Cho et al. |

FOREIGN PATENT DOCUMENTS

| JP | 2000-187209 | 7/2000 |
| JP | 2001-100652 | 4/2001 |
| JP | 2001-194659 | 7/2001 |
| JP | 2002-040485 | 2/2002 |

(Continued)

*Primary Examiner*—Wai-Sing Louie
(74) *Attorney, Agent, or Firm*—Innovation Counsel LLP

(57) ABSTRACT

A thin film transistor array panel is provided, which includes: a gate line formed on an insulating substrate; a gate insulating layer on the gate line; a semiconductor layer on the gate insulating layer; a data line formed on the gate insulating layer; a drain electrode formed at least in part on the semiconductor layer; a first passivation layer formed on the data line and the drain electrode; a color filter formed on the data line and the drain electrode; a second passivation layer formed on the color filter; and a pixel electrode formed on the color filter, connected to the drain electrode, overlapping the second passivation layer, and enclosed by the second passivation layer.

12 Claims, 9 Drawing Sheets

FOREIGN PATENT DOCUMENTS

| | | |
|---|---|---|
| JP | 2002-250933 | 9/2002 |
| KR | 10-2001-0010743 | 2/2001 |
| KR | 2001-0040098 | 5/2001 |
| KR | 1003-309925 | 9/2001 |
| KR | 2002-0046559 | 6/2002 |
| KR | 2002-0060602 | 7/2002 |
| KR | 10-2002-0071542 | 9/2002 |

* cited by examiner

LIQUID CRYSTAL DISPLAY, THIN FILM TRANSISTOR ARRAY PANEL THEREFOR, AND MANUFACTURING METHOD THEREOF

CROSS REFERENCE TO RELATED APPLICATIONS

The present application is a divisional of, claims benefit of, and incorporates by reference the disclosure of U.S. Pat. application Ser. No. 10/815,788 filed on Apr. 2, 2004 now U.S. Pat. No. 7,202,498 where the latter claims priority to and benefit of Korean Patent Application No. 2003-0021311, filed on Apr. 4, 2003,also incorporated herein by reference.

BACKGROUND OF THE INVENTION (a) Field of the Invention

The present invention relates to a liquid crystal display, a thin film transistor array panel therefor, and a manufacturing method thereof.

(b) Description of the Related Art

A liquid crystal display (LCD) is one of the most widely used flat panel displays. LCDs are used in notebook or laptop computers, desktop computer monitors and televisions. LCDs are lightweight and occupy less space than conventional cathode ray tube (CRT) displays.

The general structure of an LCD consists of a liquid crystal (LC) layer that is positioned between a pair of panels including field generating electrodes and polarizers. The LC layer is subject to an electric field generated by the electrodes and variations in the field strength change the molecular orientation of the LC layer. For example, upon application of an electric field, the molecules of the LC layer change their orientation to change the polarization of light passing through the LC layer. Appropriately positioned polarizing filters selectively block the polarized light, creating dark areas that can represent desired images.

The LCD further includes a plurality of color filters for representing color images provided on either of the panels and an organic insulating layer covering the color filters. The organic insulating layer is usually thick enough to smooth the surface of the panels such that the field generating electrodes thereon have a uniform flat surface.

However, the thick organic layer reduces the light transmittance especially for the blue light, thereby causing so called yellowish phenomenon. In addition, the thick organic layer and the color filters, which are also very thick, make it difficult to obtain smooth profiles of contact holes that are provided for the contact between the conductive layers on and under the color filters and the organic layer.

SUMMARY OF THE INVENTION

A thin film transistor array panel is provided, which includes: a gate line formed on an insulating substrate; a gate insulating layer on the gate line; a semiconductor layer on the gate insulating layer; a data line formed on the gate insulating layer; a drain electrode formed at least in part on the semiconductor layer; a first passivation layer formed on the data line and the drain electrode; a color filter formed on the data line and the drain electrode; a second passivation layer formed on the color filter; and a pixel electrode formed on the color filter, connected to the drain electrode, overlapping the second passivation layer, and enclosed by the second passivation layer.

The data line includes a pair of rectilinear portions connected to each other and making an angle of about 45 degrees.

The thin film transistor array panel may further include a storage electrode line formed on the substrate and including an expansion overlapping the pixel electrode to form a storage capacitor. The drain electrode may include an expansion overlapping the expansion of the storage electrode line.

The second passivation layer may include at least one of organic insulator and inorganic insulating material. The second passivation layer may be made of photosensitive material or acrylic resin.

The first passivation layer may have a contact hole exposing at least a portion of the drain electrode, the color filter may have an opening disposed on the drain electrode, and the pixel electrode is connected to the drain electrode through the opening and the contact hole.

The thin film transistor array panel may further include a contact assistant formed on a portion of the gate line or a portion of the data line and made of the same material as the pixel electrode.

Entire bottom surfaces of the data line and the drain electrode may be disposed substantially on the semiconductor layer, the data line and the drain electrode may have substantially the same planar shape as the semiconductor layer, and the semiconductor layer may include a portion that is not covered with the data line and the drain electrode and disposed between the source electrode and the drain electrode.

The second passivation layer and the pixel electrode may cover an entire surface of the color filter.

A liquid crystal display is provided, which includes: a first substrate; a first signal line disposed on the substrate; a second line disposed on the substrate and intersecting the first signal line; a thin film transistor connected to the first and the second signal lines; a color filter disposed on the first substrate; an insulating layer disposed on the color filter opposite the first and the second signal lines and the thin film transistor and having an opening exposing the color filter; a pixel electrode disposed on the color filter, connected to the thin film transistor, overlapping the insulating layer, and located substantially in the opening of the insulating layer; a second substrate facing the second substrate and spaced apart from the first substrate with a gap; a common electrode formed on the second substrate; a light blocking member disposed on the common electrode; and a liquid crystal layer filled in the gap between the first substrate and the second substrate.

The insulating layer and the pixel electrode may cover an entire surface of the color filter.

The light blocking member may include a first portion maintaining the gap between the first substrate and the second substrate and a second portion having a thickness lower than the first portion.

The liquid crystal layer may have negative dielectric anisotropy and may be subject to vertically alignment.

The common electrode may have a cutout.

A method of manufacturing a thin film transistor array panel is provided, which includes: forming a plurality of gate lines on a substrate; forming a first insulating layer on the gate lines; forming a semiconductor layer on the first insulating layer; forming a plurality of data lines and drain electrodes at least on the semiconductor layer; forming a second insulating layer on the data lines and the drain electrodes; forming a plurality of color filters, each containing one of red, green and blue pigments; forming a third insulating layer at least on edges of the color filters, the third insulating layer disposed opposite the gate lines and the data lines; and forming a plurality of pixel electrodes on the color filters such that the pixel electrodes and the third insulating layer cover an entire surface of the color filters.

The third insulating layer may be made of photosensitive material or acrylic resin.

The second insulating layer may have a plurality of contact holes exposing at least portions of the drain electrodes, the color filters may have a plurality of openings disposed on the drain electrodes, and the pixel electrodes are connected to the drain electrodes through the openings and the contact holes.

BRIEF DESCRIPTION OF THE DRAWINGS

The present invention will become more apparent by describing preferred embodiments thereof in detail with reference to the accompanying drawings in which.

DETAILED DESCRIPTION OF PREFERRED EMBODIMENTS

Figure 1:
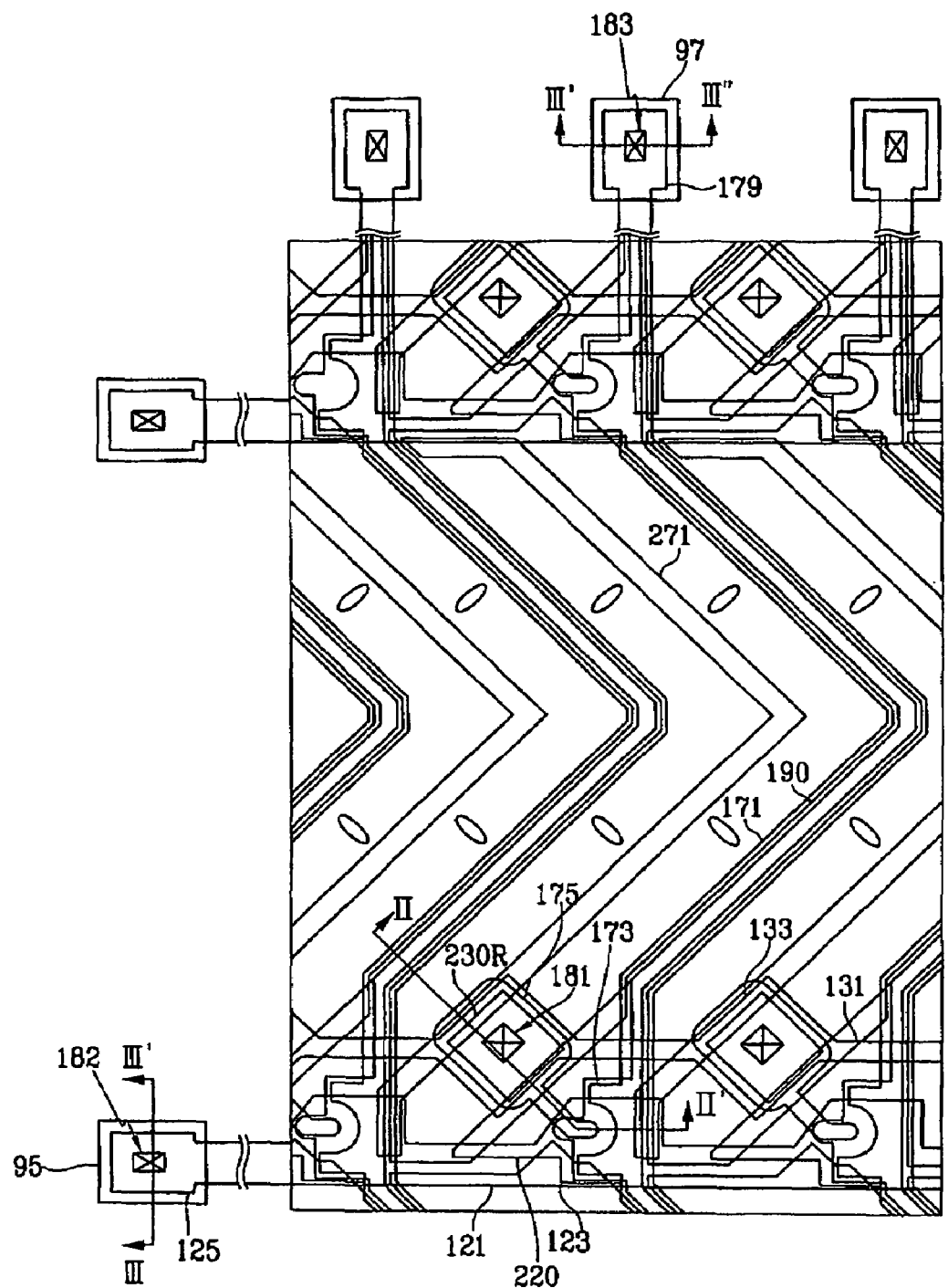
FIG. 1 is a layout view of an LCD according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, liquid crystal displays and thin film transistor (TFT) array panels for LCDs according to embodiments of the present invention will be described with reference to the accompanying drawings.

Figure 2:
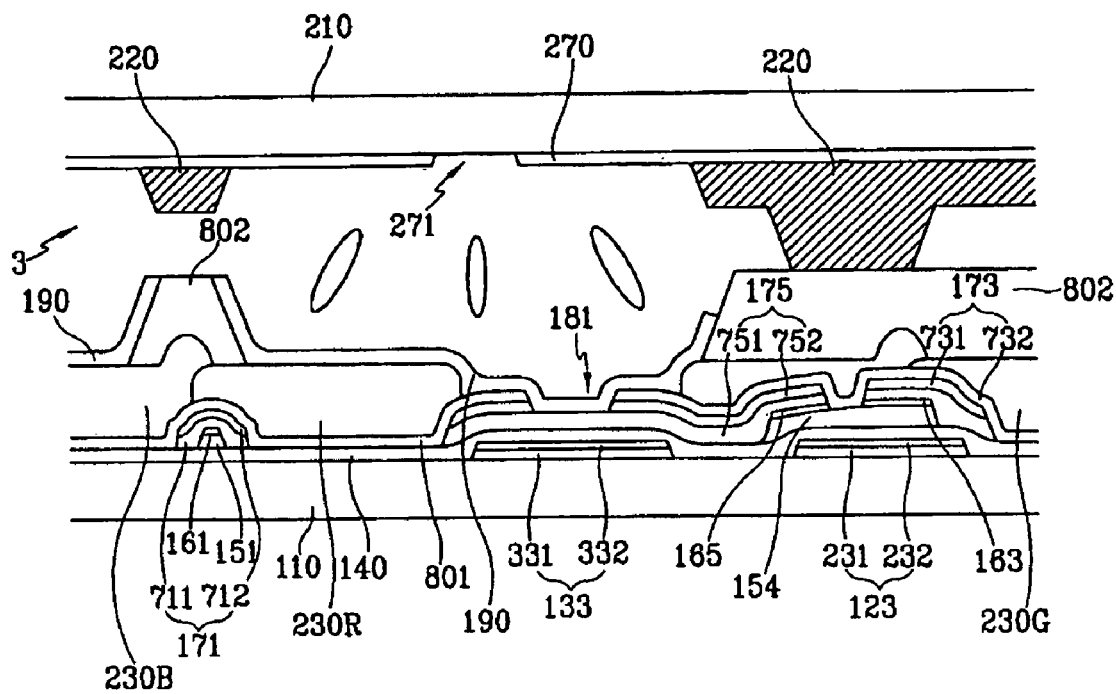
FIG. 2 is a sectional view of the LCD shown in FIG. 1 taken along the line II-II'.
Figure 3:
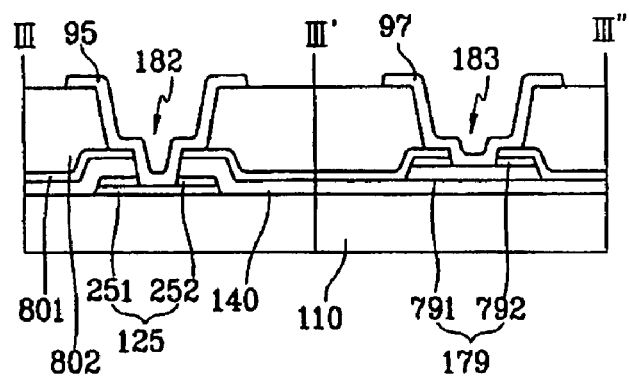
FIG. 3 is a sectional view of the LCD shown in FIG. 1 taken along the lines III-III' and III'-III''.

FIG. 1 is a layout view of an LCD according to an embodiment of the present invention, FIG. 2 is a sectional view of the LCD shown in FIG. 1 taken along the line II-II', and FIG. 3 is a sectional view of the LCD shown in FIG. 1 taken along the lines III-III' and III'-III''.

An LCD according to an embodiment of the present invention includes a TFT array panel, a common electrode panel facing the TFT array panel, and a LC layer 3 interposed between the TFT array panel and the common electrode panel.

The TFT array panel is now described in detail.

A plurality of gate lines 121 and a plurality of storage electrode lines 131 are formed on an insulating substrate 110.

The gate lines 121 extend substantially in a transverse direction and are separated from each other and transmit gate signals. Each gate line 121 includes a plurality of projections forming a plurality of gate electrodes 123 and an end portion 125 having a large area for contact with another layer or an external device.

Each storage electrode line 131 extends substantially in the transverse direction and includes a plurality of projections forming storage electrodes 133. Each storage electrode 133 has a shape of a diamond or a rectangle rotated by about 45 degrees and they are located close to the gate lines 121. The storage electrode lines 131 are supplied with a predetermined voltage such as a common voltage, which is applied to a common electrode 270 on the common electrode panel of the LCD.

The gate lines 121 and the storage electrode lines 131 have a multi-layered structure including two films having different physical characteristics, a lower film and an upper film. The upper film is preferably made of low resistivity metal including Al containing metal such as Al and Al alloy, Ag containing metal such as Ag and Ag alloy, or Cu containing metal such as Cu and Cu alloy for reducing signal delay or voltage drop in the gate lines 121 and the storage electrode lines 131. On the other hand, the lower film is preferably made of material such as Cr, Mo, Mo alloy, Ta, or Ti, which has good physical, chemical, and electrical contact characteristics with other materials such as indium tin oxide (ITO) or indium zinc oxide (IZO). A good exemplary combination of the lower film material and the upper film material is Cr and Al-Nd alloy. In FIGS. 4, the lower and the upper films of the gate electrodes 123 are indicated by reference numerals 231 and 232, respectively, the lower and the upper films of the end portions 125 are indicated by reference numerals 251 and 252, respectively, and the lower and the upper films of the storage electrodes 133 are indicated by reference numerals 331 and 332, respectively. Portions of the upper film 252 of the end portions 125 of the gate lines 121 are removed to expose the underlying portions of the lower films 251.

The gate lines 121 and the storage electrode lines 131 may have a single layer structure or may include three or more layers.

In addition, the lateral sides of the gate lines 121 and the storage electrode lines 131 are inclined relative to a surface of the substrate 110, and the inclination angle thereof ranges about 30-80 degrees.

A gate insulating layer 140 preferably made of silicon nitride (SiNx) is formed on the gate lines 121 and the storage electrode lines 131.

A plurality of semiconductor stripes 151 preferably made of hydrogenated amorphous silicon (abbreviated as "a-Si") or polysilicon are formed on the gate insulating layer 140. Each semiconductor stripe 151 extends substantially in the longitudinal direction while it is curved periodically. Each semiconductor stripe 151 has a plurality of projections 154 branched out toward the gate electrodes 123. Each semiconductor island 150 is located opposite the gate electrodes 123.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to the surface of the substrate 110, and the inclination angles thereof are preferably in a range between about 30-80 degrees.

A plurality of data lines 171 and a plurality of drain electrodes 175 separated from each other are formed on the ohmic contacts 161 and 165 and the gate insulating layer 140.

The data lines 171 for transmitting data voltages extend substantially in the longitudinal direction and intersect the gate lines 121 and the storage electrode lines 131. Each data line 171 has an end portion 179 having a large area for contact with another layer or an external device and it includes a plurality of pairs of oblique portions and a plurality of longitudinal portions such that it curves periodically. A pair of oblique portions are connected to each other to form a chevron, and opposite ends of the pair of oblique portions are connected to respective longitudinal portions. The oblique portions of the data lines 171 make an angle of about 45 degrees with the gate lines 121, and the longitudinal portions cross over the gate electrodes 123. The length of a pair of oblique portions is about one to nine times the length of a longitudinal portion, that is, it occupies about 50-90 percents of the total length of the pair of oblique portions and the longitudinal portion.

Each drain electrode 175 includes a rectangular expansion overlapping a storage electrode 133. The edges of the expansion of the drain electrode 175 are substantially parallel to the edges of the storage electrodes 133. Each longitudinal portion of the data lines 171 includes a plurality of projections such that the longitudinal portion including the projections forms a source electrode 173 partly enclosing an end portion of a drain electrode 175. Each set of a gate electrode 123, a source electrode 173, and a drain electrode 175 along with a projection 154 of a semiconductor stripe 151 form a TFT having a channel formed in the semiconductor projection 154 disposed between the source electrode 173 and the drain electrode 175.

The data lines 171 and the drain electrodes 175 also include a lower film 711 and 751 preferably made of Mo, Mo alloy or Cr and an upper film 712 and 752 located thereon and preferably made of Al containing metal. In FIGS. 4 and 5, the lower and the upper films of the source electrodes 173 are indicated by reference numerals 731 and 732, respectively, and the lower and the upper films of the end portions 179 of the data lines 171 are indicated by reference numerals 791 and 792, respectively. Portion of the upper films 792, 752 of the expansions 179 of the data lines 171 and the drain electrodes 175 are removed to expose the underlying portions of the lower films 791 and 751.

Like the gate lines 121 and the storage electrode lines 131, the data lines 171 and the drain electrodes 175 have inclined lateral sides, and the inclination angles thereof range about 30-80 degrees.

The ohmic contacts 161 and 165 are interposed only between the underlying semiconductor stripes 151 and the overlying data lines 171 and the overlying drain electrodes 175 thereon and reduce the contact resistance therebetween.

A first passivation layer 801 preferably made of inorganic insulator such as SiNx is formed on the data lines 171 and the drain electrodes 175, and exposed portions of the semiconductor stripes 151, which are not covered with the data lines 171 and the drain electrodes 175.

The first passivation layer 801 has a plurality of contact holes 181 and 183 exposing the drain electrodes 175 and the end portions 179 of the data lines 171, respectively. The first passivation layer 801 and the gate insulating layer 140 have a plurality of contact holes 182 exposing the end portions 125 of the gate lines 121. The contact holes 181, 182 and 183 can have various shapes such as polygon or circle. The area of each contact hole 182 or 183 is preferably equal to or larger than 0.5 mm×15 µm and not larger than 2 mm×60 µm. The sidewalls of the contact holes 181, 182 and 183 are inclined with an angle of about 30-85 degrees or have stepwise profiles.

A plurality of red, green and blue color filters 230R, 230G and 230B is formed on the first passivation layer 801 and they are disposed substantially between the data lines 171. The color filters 230R, 230G or 230B in adjacent two data lines 171 and arranged in the longitudinal direction may be connected to each other to form a periodically-curved stripe. The neighboring color filters 230R, 230G and 230B overlap each other on the data lines 171 to form hills. The color filters 230R, 230G and 230B have a plurality of openings exposing the contact holes 181 and a top surface of the first passivation layer 801 and are not provided on a peripheral area which is provided with the expansions 125 and 179 of the gate lines 121 and the data lines 179.

A second passivation layer 802 preferably made of photosensitive organic material such as acrylic photosensitive resin is formed on the color filters 230R, 230G and 230B. The second passivation layer 802 is disposed opposite the gate lines 121, the data lines 171, and the TFTs, and in particular, it covers edges of the color filters 230R, 230G and 230B to be prevented from being damaged by subsequent etching and cleaning processes. However, the second passivation layer 802 is not disposed on most areas enclosed by the gate lines 121 and the data lines 171 such that it does not decrease the transmittance of light in the areas. The second passivation layer 802 has a flat uniform surface such that it smoothes the step difference due to the hills formed by the color filters 230R, 230G and 230B. The second passivation layer 802 may be made of inorganic insulator such as SiNx and $SiO_2$.

A plurality of pixel electrodes 190 and a plurality of contact assistants 95 and 97, which are preferably made of ITO or IZO, are formed on the color filters 230R, 230G and 230B and the second passivation layer 802.

Each pixel electrode 190 is located substantially in an area enclosed by the data lines 171 and the gate lines 121, and thus it also forms a chevron. The pixel electrodes 190 cover the storage electrode lines 131 including the storage electrodes 133 and the expansions of the drain electrodes 175 and have chamfered edges substantially parallel to edges of the storage electrodes 133 that are close to the chamfered edges.

621 The pixel electrodes 190 and the second passivation layer 802 cover an entire surfaces of the color filters 230R, 230G and 230B such that the color filters 230R, 230G and 230B are prevented from being damaged by following processes and from contaminating overlying layers and the LC layer 3. However, the second passivation layer 180 overlaps the pixel electrodes 190 only near the boundaries of the pixel electrodes 190 and most portions of the pixel electrodes 190 are disposed directly on the color filters 230R, 230G and 230B such that the second passivation layer 802 does not decrease the light transmittance passing through the pixel electrodes 190.

631 The pixel electrodes 190 are physically and electrically connected to the drain electrodes 175 through the contact holes 181 such that the pixel electrodes 190 receive the data voltages from the drain electrodes 175. The pixel electrodes 190 supplied with the data voltages generate electric fields in cooperation with the common electrode 270, which reorient liquid crystal molecules disposed therebetween.

A pixel electrode 190 and a common electrode form a capacitor called a "liquid crystal capacitor," which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 190 with the storage electrode lines 131. The capacitances of the storage capacitors, i.e., the storage capacitances are increased by providing the projections (i.e., the storage electrodes) 133 at the storage electrode lines 131, elongating the drain electrodes 175 connected to the pixel electrodes 190, and providing the expansions at the drain electrodes 175 overlapping the storage electrodes 133 of the storage electrode lines 131 for decreasing the distance between the terminals and increasing the overlapping areas.

The pixel electrodes 190 overlap the data lines 171 as well as the gate lines 121 to increase aperture ratio.

The contact assistants 95 and 97 are connected to the exposed end portions 125 of the gate lines 121 and the exposed end portions 179 of the data lines 171 through the contact holes 181 and 182, respectively. The contact assistants 95 and 97 protect the exposed portions 125 and 179 and complement the adhesiveness of the exposed portions 125 and 179 and external devices.

Finally, an alignment layer (not shown) is formed on the pixel electrodes 190, the contact assistants 95 and 97, and the second passivation layer 802.

The description of the common electrode panel follows.

A common electrode 270 preferably made of transparent conductive material such as ITO and IZO is formed on an insulating substrate 210 such as transparent glass. The common electrode 270 is supplied with the common voltage and it has a plurality of chevron-like cutouts 271. Each cutout 271 includes a pair of oblique portions connected to each other, a transverse portion connected to one of the oblique portions, and a longitudinal portion connected to the other of the oblique portions. The oblique portions of the cutout 271 extend substantially parallel to the oblique portions of the data lines 171 and face a pixel electrode 190 so that they may bisect the pixel electrode 190 into left and right halves. The transverse and the longitudinal portions of the cutout 271 are aligned with transverse and longitudinal edges of the pixel electrode 190, respectively, and they make obtuse angles with the oblique portions of the cutout 190. The cutouts 271 are provided for controlling the tilt directions of the LC molecules in the LC layer. The cutouts 271 may be substituted with protrusions preferably made of organic material.

A light blocking member called a black matrix 220 is formed on the common electrode 270. The light blocking member 220 includes a plurality of oblique portions facing the oblique portions of the data lines 171 and a plurality of right-angled-triangular portions facing the TFTs and the longitudinal portions of the data lines 171 such that the light blocking member 220 prevents light leakage between the pixel electrodes 190 and defines open areas facing the pixel electrodes 190. Each of the triangular portions of the light blocking member 220 has a hypotenuse parallel to a chamfered edge of a pixel electrode 190. The triangular portions is thicker than the oblique portions to serve as columnar spacers defining a gap between the TFT array panel and the common electrode panel, which is filled with the liquid crystal layer 3. The thickness of the triangular portions is relatively low compared with a case that there is no thick second passivation layer on the TFTs.

A homogeneous or homeotropic alignment layer (not shown) is coated on the common electrode 270 and the light blocking member 220.

A pair of polarizers (not shown) are provided on outer surfaces of the panels such that their transmissive axes are crossed and one of the transmissive axes is parallel to the gate lines 121.

The LCD may further include at least one retardation film for compensating the retardation of the LC layer 3 and a backlight unit for providing light for the LCD.

The LC layer 3 has negative dielectric anisotropy and the LC molecules in the LC layer 3 are aligned such that their long axes are vertical to the surfaces of the panels in absence of electric field.

Upon application of the common voltage to the common electrode 270 and a data voltage to the pixel electrodes 190, a primary electric field substantially perpendicular to the surfaces of the panels is generated. The LC molecules tend to change their orientations in response to the electric field such that their long axes are perpendicular to the field direction. In the meantime, the cutouts 271 of the common electrode 270 and the edges of the pixel electrodes 190 distort the primary electric field to have a horizontal component which determines the tilt directions of the LC molecules. The horizontal component of the primary electric field is perpendicular to the edges of the cutouts 271 and the edges of the pixel electrodes 190.

Accordingly, four sub-regions having different tilt directions, which are partitioned by edges of a pixel electrode 190, a cutout 271 bisecting the pixel electrode 190, and an imaginary transverse center line passing through the meeting point of the oblique portions of the cutout 271, are formed in a pixel region of the LC layer 3, which are located on the pixel electrode 190. Each sub-region has two major edges defined by the cutout 271 and an oblique edge of the pixel electrode 190, respectively. The number of the sub-regions can be varied by changing the number of the cutouts 271 of the common electrode 270, by providing cutouts at the pixel electrodes 190, or by changing the number of curved points of the edges of the pixel electrodes 190. The sub-regions are classified into a plurality of, preferably four, domains based on the tilt directions.

In the meantime, the direction of a secondary electric field due to the voltage difference between the pixel electrodes 190 is perpendicular to the edges of the cutouts 271. Accordingly, the field direction of the secondary electric field coincides with that of the horizontal component of the primary electric field. Consequently, the secondary electric field between the pixel electrodes 190 enhances the determination of the tilt directions of the LC molecules.

Since the LCD performs inversion such as dot inversion, column inversion, etc., adjacent pixel electrodes are supplied with data voltages having opposite polarity with respect to the common voltage and thus a secondary electric field between the adjacent pixel electrodes 190 is almost always generated to enhance the stability of the domains.

Since the tilt directions of all domains make an angle of about 45 degrees with the gate lines 121, which are parallel to or perpendicular to the edges of the panels, and the 45-degree intersection of the tilt directions and the transmissive axes of the polarizers gives maximum transmittance, the polarizers can be attached such that the transmissive axes of the polarizers are parallel to or perpendicular to the edges of the panels and it reduces the production cost.

The resistance increase of the data lines 171 due to the curving can be compensated by widening the data lines 171 since distortion of the electric field and increase of the parasitic capacitance due to the increase of the width of the data lines 171 can be compensated by maximizing the size of the pixel electrodes 190 and by adapting the thick organic passivation layer 802.

Since the color filters 230R, 230G and 230B and the pixel electrodes 190 are provided on the TFT array panel, an alignment error between the color filters 230R, 230G and 230B and the pixel electrodes 190 is reduced. In addition, there is no overcoat on the common electrode panel.

A method of manufacturing the TFT array panel shown in FIGS. 1-3 according to an embodiment of the present invention will be now described in detail with reference to FIGS. 4A, 4B, 5A and 5B as well as FIGS. 1-3.

Figure 4A:
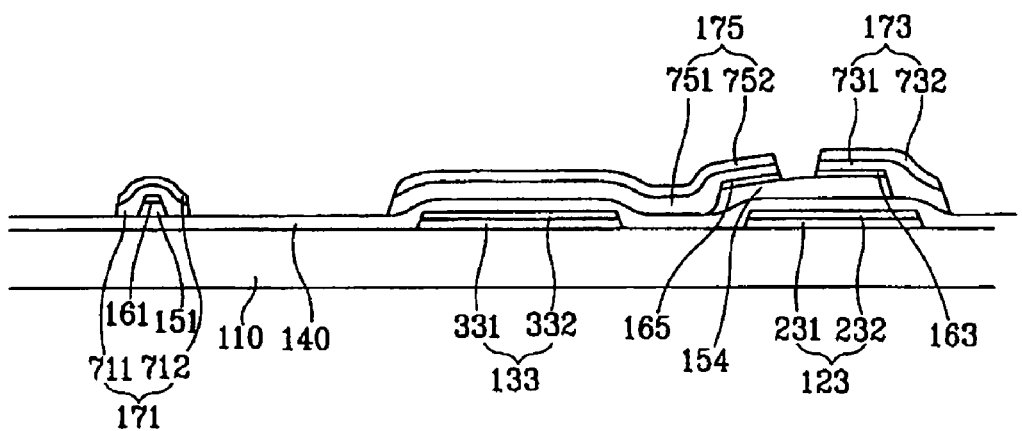
FIGS. 4A and 4B are sectional views of the TFT array panel shown in FIGS. 1-3 taken along the line II-II' and the lines III-III' and III'-III'', respectively, in an intermediate step of a manufacturing method thereof according to an embodiment of the present invention.
Figure 4B:
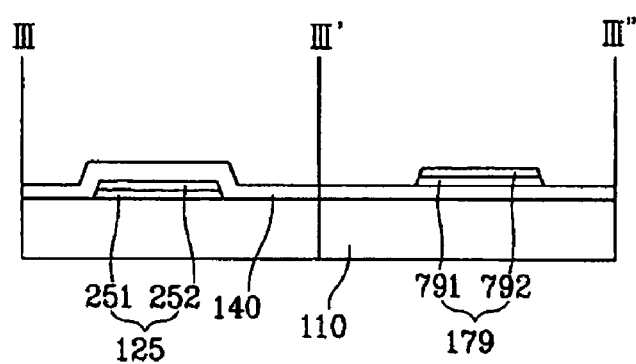
Figure 5A:
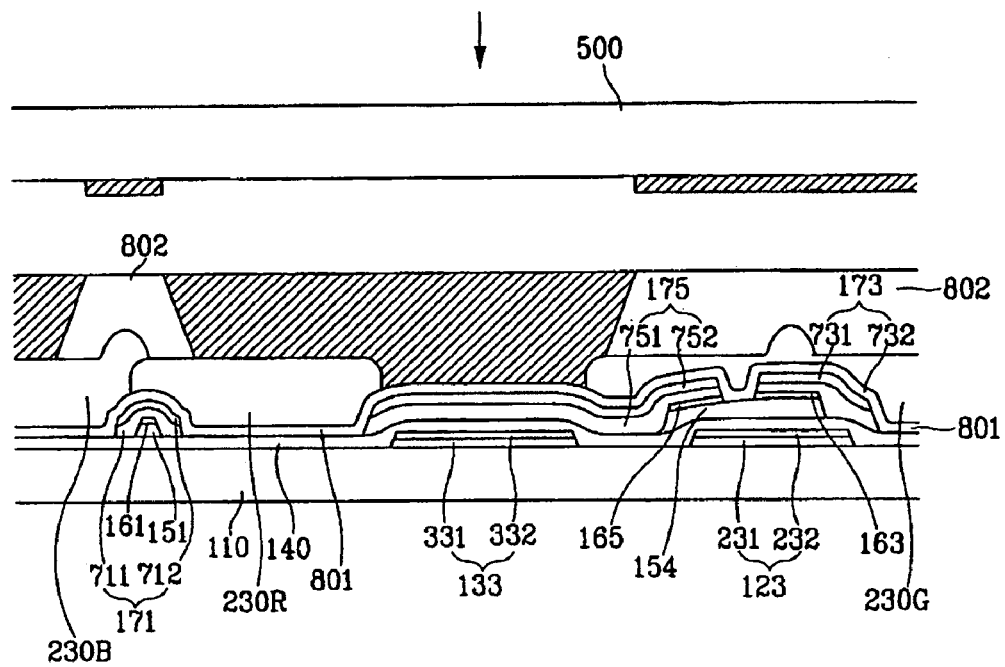
FIGS. 5A and 5B are sectional views of the TFT array panel shown in FIGS. 1-3 taken along the line II-II' and the lines III-III' and III'-III'', respectively, in the step of the manufacturing method following the step shown in FIGS. 4A and 4B.
Figure 5B:
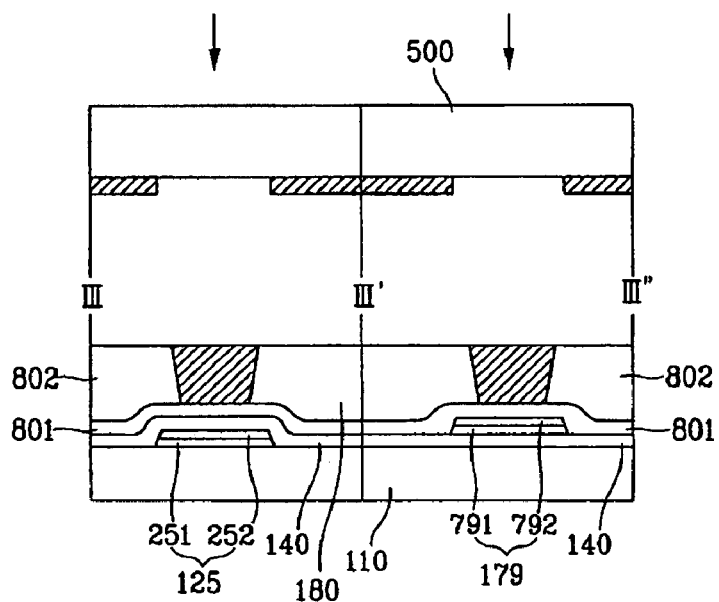

FIGS. 4A and 4B are sectional views of the TFT array panel shown in FIGS. 1-3 taken along the line II-II' and the lines III-III' and III'-III'', respectively, in an intermediate step of a manufacturing method thereof according to an embodiment of the present invention, and FIGS. 5A and 5B are sectional views of the TFT array panel shown in FIGS. 1-3 taken along the line II-II' and the lines III-III' and'', respectively, in the step of the manufacturing method following the step shown in FIGS. 4A and 4B.

Referring to FIGS. 1, 4A and 4B, a lower conductive film preferably made of Cr, Mo, or Mo alloy and an upper conductive film preferably made of Al containing metal or Ag containing metal are sputtered in sequence on an insulating substrate 110 and they are wet or dry etched in sequence to form a plurality of gate lines 121, each including a plurality of gate electrodes 123 and an expansion 125, and a plurality of storage electrode lines 131 including a plurality of storage electrodes 133. In FIGS. 4A and 4B, the lower and the upper films of the gate electrodes 123 are indicated by reference numerals 231 and 232, respectively, the lower and the upper films of the expansions 125 are indicated by reference numerals 251 and 252, respectively, and the lower and the upper films of the storage electrodes 133 are indicated by reference numerals 331 and 332, respectively.

After sequential deposition of a gate insulating layer 140 with thickness of about 1,500-5,000 Å, an intrinsic a-Si layer with thickness of about 500-2,000 Å, and an extrinsic a-Si layer with thickness of about 300-600 Å, the extrinsic a-Si layer and the intrinsic a-Si layer are photo-etched to form a plurality of extrinsic semiconductor stripes and a plurality of intrinsic semiconductor stripes 151 including a plurality of projections 154 on the gate insulating layer 140.

Subsequently, two conductive films including a lower conductive film and an upper conductive film and having a thickness of 1,500-3,000 Å are sputtered in sequence and patterned to form a plurality of date lines 171, each including a plurality of source electrodes 173 and an expansion 179, and a plurality of drain electrodes 175. The lower conductive film is preferably made of Cr, Mo, or Mo alloy, and the upper conductive film is preferably made of Al containing metal or Ag containing metal. In FIGS. 4A and 4B, the lower and the upper films of the drain electrodes 171 are indicated by reference numerals 711 and 712, respectively, the lower and the upper films of the source electrodes 173 are indicated by reference numerals 731 and 732, respectively, the lower and the upper films of the drain electrodes 175 are indicated by reference numerals 751 and 752, respectively, and the lower and the upper films of the end portions 179 of the data lines 171 are indicated by reference numerals 791 and 792, respectively.

Thereafter, portions of the extrinsic semiconductor stripes, which are not covered with the data lines 171 and the drain electrodes 175, are removed to complete a plurality of ohmic contact stripes 161 including a plurality of projections 163 and a plurality of ohmic contact islands 165 and to expose portions of the intrinsic semiconductor stripes 151. Oxygen plasma treatment preferably follows in order to stabilize the exposed surfaces of the semiconductor stripes 151.

Referring to FIGS. 1, 5A and 5B, a first passivation layer 801 made of a inorganic insulator such as silicon nitride is deposited.

After removing the exposed portions of the gate insulating layer 140 to expose the underlying portions of the expansions 125 of the gate lines 121, the exposed portions of the upper conductive films 752, 792 and 252 of the drain electrodes 175, the expansions 179 of the data lines 171, and the expansions 125 of the gate lines 121 are removed to expose underlying portions of the lower conductive films 751, 791 and 251 of the drain electrodes 175, the expansions 179 of the data lines 171, and the expansions 125 of the gate lines 121.

Next, photosensitive organic films respectively containing red, green, and blue pigments are coated on the first passivation layer 801 and patterned by photolithography to form a plurality of color filters 230R, 230G and 230B having a plurality of openings in a sequential manner.

Subsequently, a second passivation layer 802 made of a low-resistivity acrylic organic insulator is coated and exposed through a photo-mask 500 having a plurality of transmissive areas and light blocking areas. The second passivation layer 802 is then developed to expose the underlying color filters 230R, 230G and 230B as well as the openings of the color filters 230R, 230G and 230B.

A photoresist (not shown) is formed thereon and the first passivation layer 801 is then patterned along with the gate insulating layer 140 using the photoresist as an etch mask to form a plurality of contact holes 181, 182 and 183 exposing portions of the drain electrodes 175, the expansions 125 of the gate lines 121, and portions of the expansions 179 of the data lines 171, respectively. Since the color filters 230R, 230G and 230B may be consumed along with the photoresist, the thickness of the color filters 230R, 230G and 230B is preferably determined in consideration of the consumed thickness in this step.

Finally, a plurality of pixel electrodes 190 and a plurality of contact assistants 92 and 97 are formed on the color filters 230R, 230G and 230B and the second passivation layer 802 and on the exposed portions of the lower conductive films 751, 791 and 251 of the drain electrodes 175, the expansions 125 of the gate lines 121, and the expansions 179 of the data lines 171 by sputtering and photo-etching an IZO or ITO layer with thickness of about 400-500 Å as shown in FIGS. 1-3.

The common electrode panel shown in FIGS. 1-3 according to an embodiment of the present invention will be now described in detail.

An ITO or IZO layer is deposited to form a common electrode 270 and the common electrode 270 is patterned to form a plurality of cutouts 271.

A photosensitive organic insulating layer (not shown) containing black pigment is coated. The photosensitive layer is then exposed through a photo-mask (not shown) having a plurality of transmissive areas, a plurality of slit areas facing the gate lines 121 and the data lines 171 as well as the TFTs on the TFT array panel, and a plurality of light blocking areas facing the TFTs. Accordingly, portions of the photosensitive layer facing the transmissive areas absorb the full energy of the light, while portions of the photosensitive layer facing the slit areas partially absorb the light energy. The photosensitive layer is then developed to form a light blocking member 220 having position-dependent thickness.

An LCD according to another embodiment of the present invention will be described in detail with reference to FIGS. 6-8.

Figure 6:
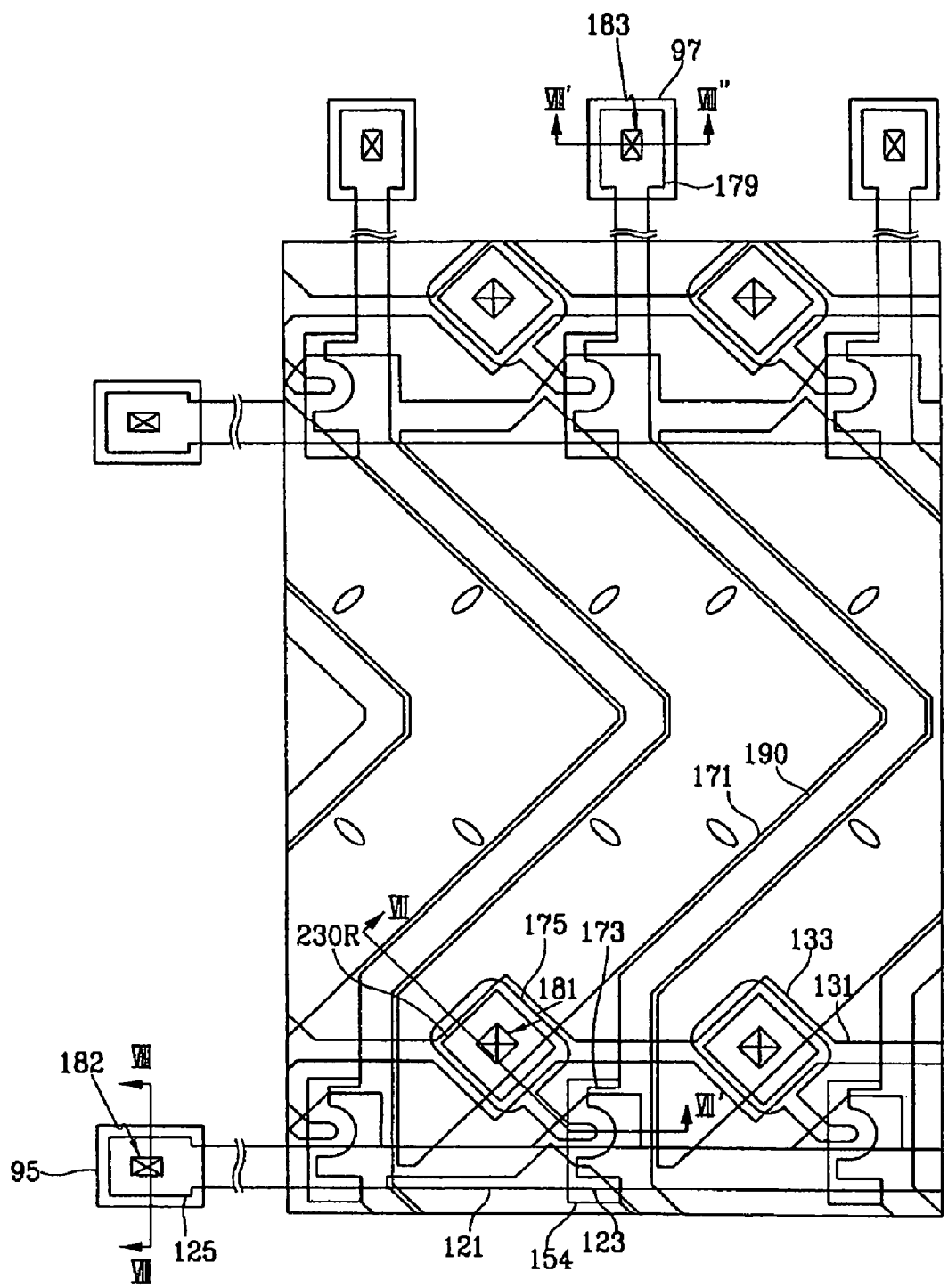
FIG. 6 is a layout view of an LCD according to another embodiment of the present invention.
Figure 7:
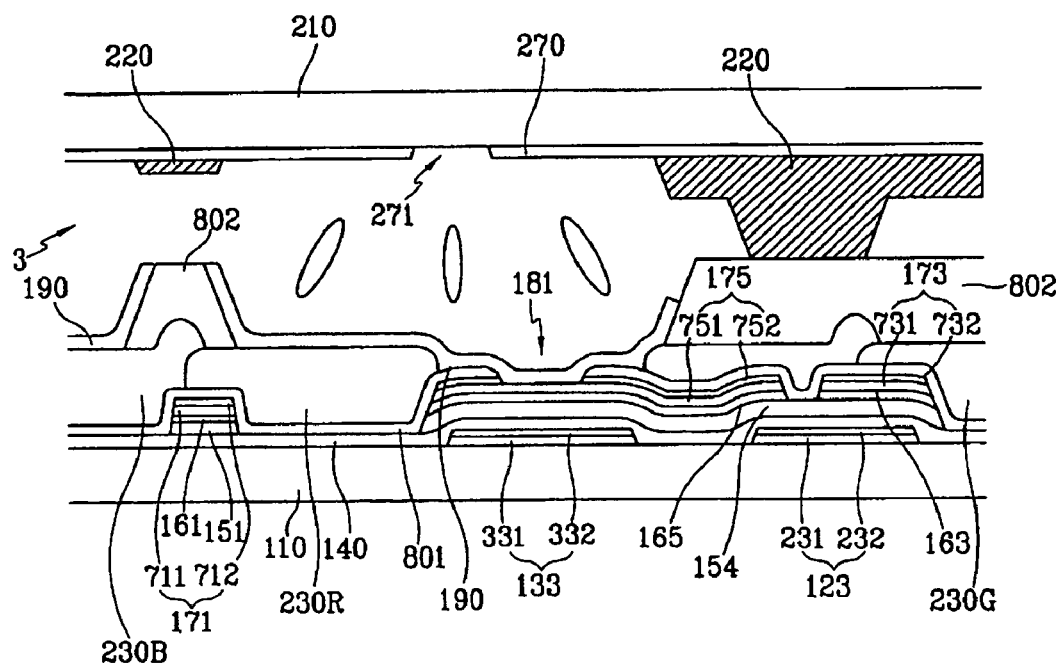
FIG. 7 is a sectional view of the LCD shown in FIG. 6 taken along the line VII-VII'.
Figure 8:
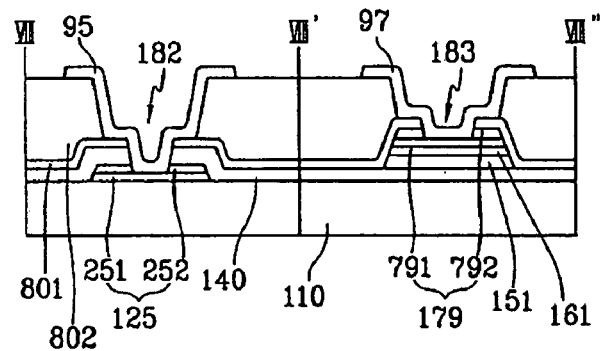
FIG. 8 is a sectional view of the LCD shown in FIG. 6 taken along the lines VIII-VIII' and VIII'-VIII''.

FIG. 6 is a layout view of an LCD according to another embodiment of the present invention, FIG. 7 is a sectional view of the LCD shown in FIG. 6 taken along the line VII-VII', and FIG. 8 is a sectional view of the LCD shown in FIG. 6 taken along the lines VIII-VIII' and VIII'-VIII".

Referring to FIGS. 6-8, an LCD according to this embodiment also includes a TFT array panel, a common electrode panel, and a LC layer 3 interposed therebetween.

Layered structures of the panels according to this embodiment are almost the same as those shown in FIGS. 1-3.

Regarding the TFT array panel, a plurality of gate lines 121 including a plurality of gate electrodes 123 and a plurality of storage electrode lines 131 including a plurality of storage electrodes 133 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173 and a plurality of drain electrodes 175 are formed on the ohmic contacts 161 and 165, and a first passivation layer 801 is formed thereon. A plurality of red, green and blue color filters 230R, 230G and 230B are formed on the first passivation layer 801 and a second passivation layer 802 is formed thereon. A plurality of contact holes 181, 182 and 183 are provided at the first passivation layer 801 and the gate insulating layer 140, and a plurality of pixel electrodes 190 and a plurality of contact assistants 95 and 97 are formed on the color filters 230R, 230G and 230B the second passivation layer 802.

Regarding the common electrode panel, a common electrode 270 and a light blocking member 220 are formed on an insulating substrate 210.

Different from the LCD shown in FIGS. 1-3, the semiconductor stripes 151 have almost the same planar shapes as the data lines 171 and the drain electrodes 175 as well as the underlying ohmic contacts 161 and 165,. However, the projections 154 of the semiconductor stripes 151 include some exposed portions, which are not covered with the data lines 171 and the drain electrodes 175, such as portions located between the source electrodes 173 and the drain electrodes 175.

Many of the above-described features of the LCD shown in FIGS. 1-3 may be appropriate to the LCD shown in FIGS. 6-8.

Now, a method of manufacturing the TFT array panel shown in FIGS. 6-8 according to an embodiment of the present invention will be described in detail.

Figure 9A:
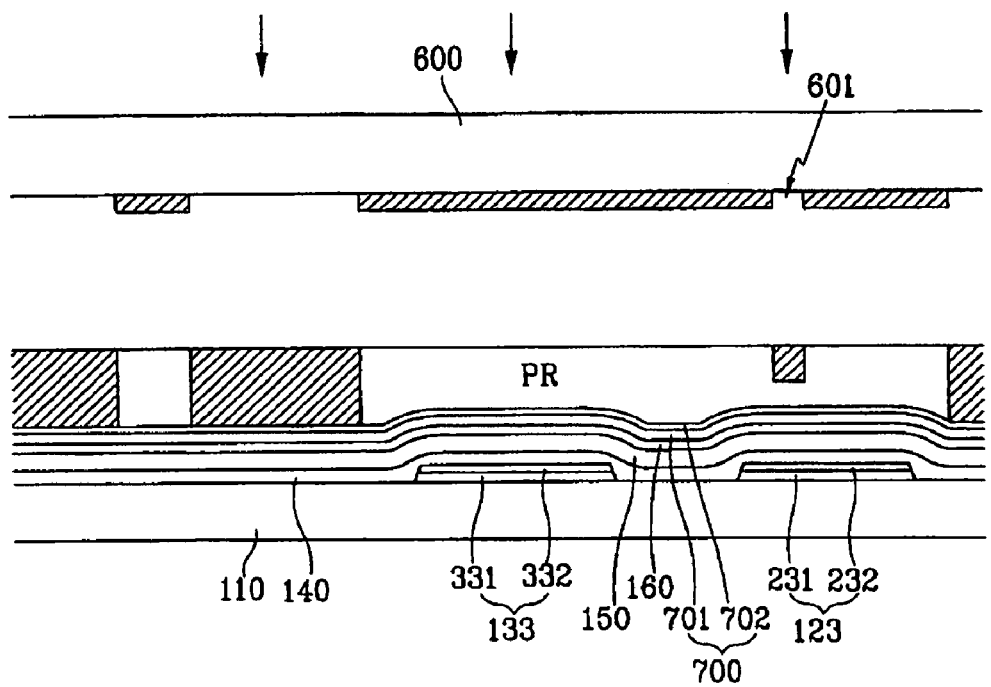
FIGS. 9A and 9B are sectional views of the TFT array panel shown in FIGS. 6-8 taken along the line VII-VII' and the lines VIII-VIII' and VIII'-VIII'', respectively, in an intermediate step of a manufacturing method thereof according to an embodiment of the present invention.
Figure 9B:
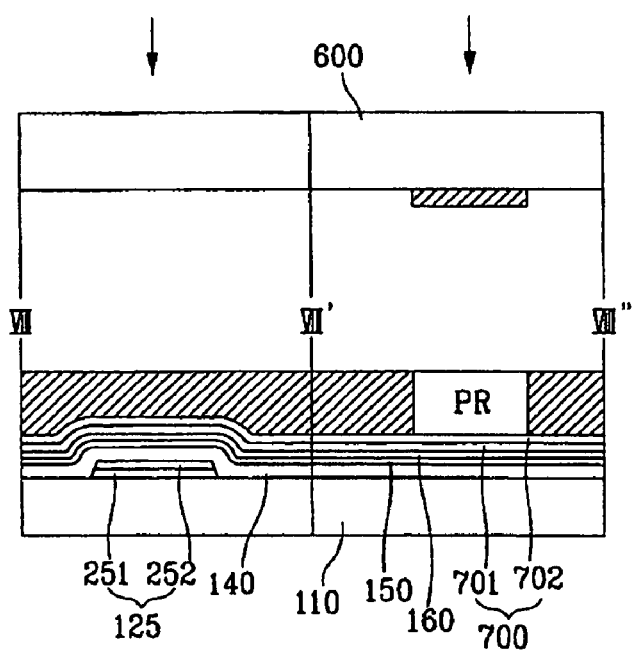
Figure 10A:
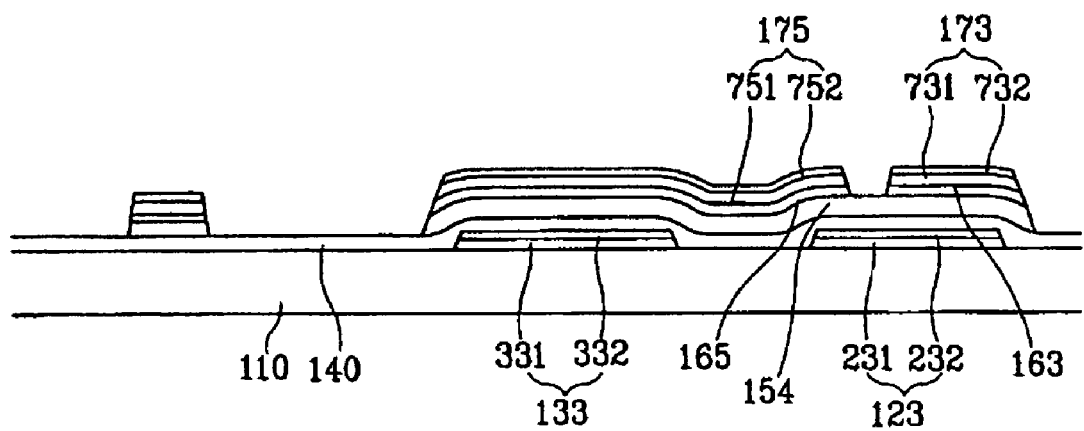
FIGS. 10A and 10B are sectional views of the TFT array panel shown in FIGS. 6-8 taken along the line VII-VII' and the lines VIII-VIII' and VIII'-VIII'', respectively, in the step of the manufacturing method following the step shown in FIGS. 9A and 9B.
Figure 10B:
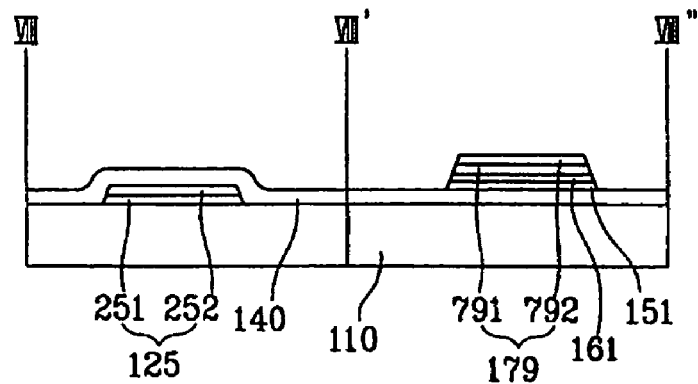
Figure 11A:
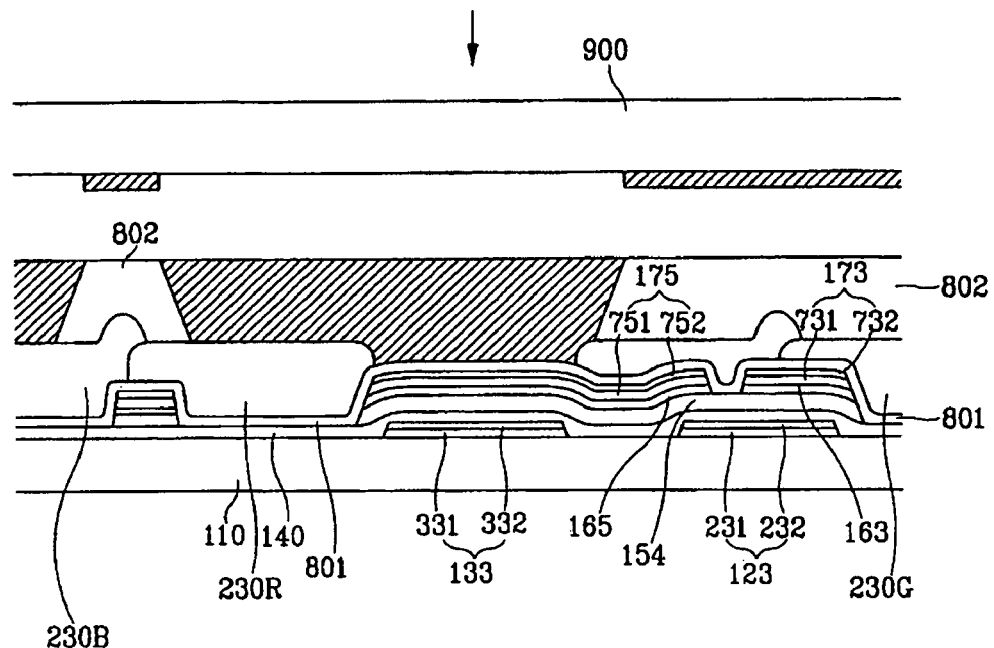
FIGS. 11A and 11B are sectional views of the TFT array panel shown in FIGS. 6-8 taken along the line VII-VII' and the lines VIII-VIII' and VIII'-VIII'', respectively, in the step of the manufacturing method following the step shown in FIGS. 10A and 10B.
Figure 11B:
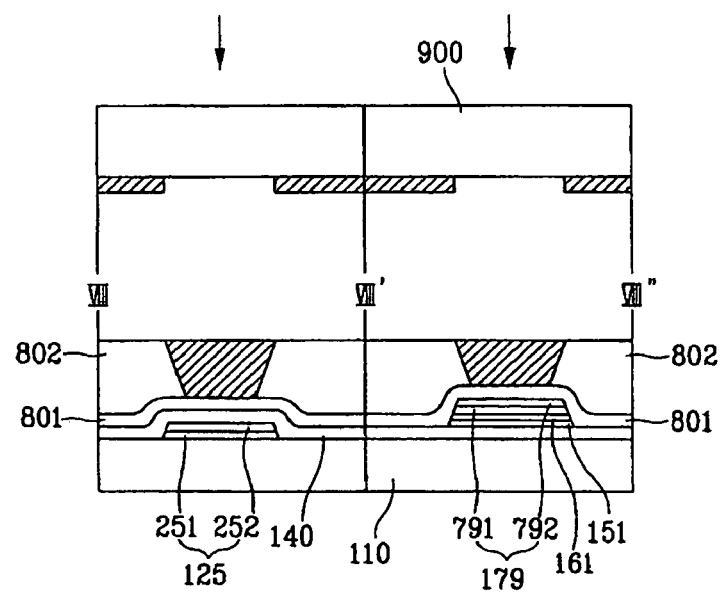

FIGS. 9A and 9B are sectional views of the TFT array panel shown in FIGS. 6-8 taken along the line VII-VII' and the lines VIII-VIII' and VIII'-VIII", respectively, in an intermediate step of a manufacturing method thereof according to an embodiment of the present invention; FIGS. 10A and 10B are sectional views of the TFT array panel shown in FIGS. 6-8 taken along the line VII-VII' and the lines VIII-VIII' and VIII'-VIII" in the step of the manufacturing method following the step shown in FIGS. 9A and 9B; and FIGS. 11A and 11B are sectional views of the TFT array panel shown in FIGS. 6-8 taken along the line VII-VII' and the lines VIII-VIII' and VIII'-VIII" in the step of the manufacturing method following the step shown in FIGS. 10A and 10B.

Referring to FIGS. 9A and 9B, two conductive films, a lower conductive film and an upper conductive film are sputtered in sequence on an insulating substrate 110 and they are wet or dry etched in sequence to form a plurality of gate lines 121, each including a plurality of gate electrodes 123 and an expansion 125, and a plurality of storage electrode lines 131 including a plurality of storage electrodes 133. In FIGS. 9A and 9B, the lower and the upper films of the gate electrodes 123 are indicated by reference numerals 231 and 232, respectively, the lower and the upper films of the expansions 125 are indicated by reference numerals 251 and 252, respectively, and the lower and the upper films of the storage electrodes 133 are indicated by reference numerals 331 and 332, respectively.

Next, a gate insulating layer 140, an intrinsic a-Si layer 150, and an extrinsic a-Si layer 160 are sequentially deposited by CVD such that the layers 140, 150 and 160 bear thickness of about 1,500-5,000 Å, about 500-2,000 Å and about 300-600 Å, respectively. A conductive layer 170 including a lower film 701 and an upper film 702 is deposited by sputtering, and a photoresist film PR with the thickness of about 1-2 microns is coated on the conductive layer 170.

The photoresist film PR is exposed to light through an exposure mask 600 including slit areas 601, and developed such that the developed photoresist PR has a position dependent thickness. The photoresist PR shown in FIGS. 9A and 9B includes a plurality of first to third portions with decreased thickness. The first portions are located on first areas (referred to as "wire areas" hereinafter) and the second portions are located on second areas (referred to as "channel areas" hereinafter), respectively, while the third portions located on remaining third areas are not illustrated in the figures since they have substantially zero thickness to expose underlying portions of the conductive layer 170.

The different thickness of the photoresist PR enables to selectively etch the underlying layers when using suitable process conditions. Therefore, a plurality of data lines 171 including a plurality of source electrodes 173, and a plurality of drain electrodes 175 as well as a plurality of ohmic contact stripes 161 including a plurality of projections 163, a plurality of ohmic contact islands 165 and a plurality of semiconductor stripes 151 including a plurality of projections 154 are obtained by a series of etching steps as shown in FIGS. 10A and 10B. In FIGS. 10A and 10B, the lower and the upper films of the drain electrodes 171 are indicated by reference numerals 711 and 712, respectively, the lower and the upper films of the source electrodes 173 are indicated by reference numerals 731 and 732, respectively, the lower and the upper films of the drain electrodes 175 are indicated by reference numerals 751 and 752, respectively, and the lower and the upper films of the end portions 179 of the data lines 171 are indicated by reference numerals 791 and 792, respectively.

For descriptive purpose, portions of the conductive layer 170, the extrinsic a-Si layer 160, and the intrinsic a-Si layer 150 on the wire areas are called first portions, portions of the conductive layer 170, the extrinsic a-Si layer 160, and the intrinsic a-Si layer 150 on the channel areas are called second portions, and portions of the conductive layer 170, the extrinsic a-Si layer 160, and the intrinsic a-Si layer 150 on the third areas are called third portions.

An exemplary sequence of forming such a structure is as follows:

(1) Removal of third portions of the conductive layer 170, the extrinsic a-Si layer 160 and the intrinsic a-Si layer 150 on the wire areas;

(2) Removal of the second portions of the photoresist;

(3) Removal of the second portions of the conductive layer 170 and the extrinsic a-Si layer 160 on the channel areas; and (4) Removal of the first portions of the photoresist.

Another exemplary sequence is as follows:

(1) Removal of the third portions of the conductive layer 170;

(2) Removal of the second portions of the photoresist;

(3) Removal of the third portions of the extrinsic a-Si layer 160 and the intrinsic a-Si layer 150;

(4) Removal of the second portions of the conductive layer 170;

(5) Removal of the first portions of the photoresist; and (6) Removal of the second portions of the extrinsic a-Si layer 160.

first example is described in detail.

At first, the exposed third portions of the conductive layer 170 on the third areas are removed by wet etching or dry etching to expose the underlying third portions of the extrinsic a-Si layer 160. The dry etching may etch out the top portions of the photoresist PR.

Next, the third portions of the extrinsic a-Si layer 160 on the third areas and of the intrinsic a-Si layer 150 are removed preferably by dry etching and the second portions of the photoresist PR are removed to expose the second portions of the conductors 170. The removal of the second portions of the photoresist PR are performed either simultaneously with or independent from the removal of the third portions of the extrinsic a-Si layer 160 and of the intrinsic a-Si layer 150. A gas mixture of $SF_6$ and HCl or a gas mixture of $SF_6$ and $O_2$ can etch the a-Si layers 150 and 160 and the photoresist PR by nearly the same etching ratio. Residue of the second portions of the photoresist PR remained on the channel areas is removed by ashing.

Next, the third portions of the extrinsic a-Si layer 160 on the third areas and of the intrinsic a-Si layer 150 are removed preferably by dry etching and the second portions of the photoresist PR are removed to expose the second portions of the conductors 170. The removal of the second portions of the photoresist PR are performed either simultaneously with or independent from the removal of the third portions of the extrinsic a-Si layer 160 and of the intrinsic a-Si layer 150. A gas mixture of $SF_6$ and HCl or a gas mixture of $SF_6$ and $O_2$ can etch the a-Si layers 150 and 160 and the photoresist PR by nearly the same etching ratio. Residue of the second portions of the photoresist PR remained on the channel areas is removed by ashing.

The semiconductor stripes 151 are completed in this step.

Next, the second portions of the conductors 170 and the extrinsic a-Si layer 160 on the channel areas as well as the first portion of the photoresist PR are removed.

Both the conductors 170 and the extrinsic a-Si layer 160 may be dry etched.

Alternatively, the conductors 170 are wet etched, while the extrinsic a-Si layer 160 is dry-etched. Since the wet etch etches out lateral sides of the conductors 170, while the dry etch hardly etch out lateral sides of the extrinsic a-Si layer 160, step-wise lateral profiles are obtained. Examples of the gas mixtures are $CF_4$ and HCl and $CF_4$ and $O_2$, as described above. The latter gas mixture leaves uniform thickness of the intrinsic semiconductor stripes 151.

In this way, each conductor 170 is divided into a data line 171 and a plurality of drain electrodes 175 to be completed, and the extrinsic a-Si layer 160 is divided into an ohmic contact stripe 161 and a plurality of ohmic contact islands 165 to be completed.

Referring to FIGS. 11A and 11B, a first passivation layer 801 made of a inorganic insulator such as silicon nitride is deposited and patterned along with the gate insulating layer 140 to form a plurality of contact holes 181, 182 and 183 exposing portions of the drain electrodes 175, the expansions 125 of the gate lines 121, and portions of the expansions 179 of the data lines 171, respectively.

After removing the exposed portions of the gate insulating layer 140 to expose the underlying portions of the expansions 125 of the gate lines 121, the exposed portions of the upper conductive films 752, 792 and 252 of the drain electrodes 175, the expansions 179 of the data lines 171, and the expansions 125 of the gate lines 121 are removed to expose underlying portions of the lower conductive films 751, 791 and 251 of the drain electrodes 175, the expansions 179 of the data lines 171, and the expansions 125 of the gate lines 121.

Next, photosensitive organic films respectively containing red, green, and blue pigments are coated on the first passivation layer 801 and patterned by photolithography to form a plurality of color filters 230R, 230G and 230B having a plurality of openings in a sequential manner.

Subsequently, a second passivation layer 802 made of a low-resistivity acrylic organic insulator is coated and exposed through a photo-mask 900 having a plurality of transmissive areas and light blocking areas. The second passivation layer 802 is then developed to be completed.

The second passivation layer 802 may be made of a photo-insensitive organic insulator or inorganic insulator having a low dielectric constant less than 4. In this case, an additional etching step for patterning the second passivation layer 802 is required.

Finally, a plurality of pixel electrodes 190 and a plurality of contact assistants 92 and 97 are formed on the color filters 230R, 230G and 230B and the second passivation layer 802 and on the exposed portions of the lower conductive films 751, 791 and 251 of the drain electrodes 175, the expansions 125 of the gate lines 121, and the expansions 179 of the data lines 171 by sputtering and photo-etching an IZO or ITO film with thickness of about 400-500 Å as shown in FIGS. 6-8.

The etching of the IZO film may include wet etching using a Cr etchant such as $HNO_3/(NH_4)_2Ce(NO_3)_6/H_2O$, which does not erode the exposed Al portions of the drain electrodes 175, the gate lines 121, and the data lines 171 through the contact holes 181, 182 and 183. A preferred deposition temperature for minimizing the contact resistance ranges from room temperature to about 200° C. A sputtering target for depositing IZO preferably includes $In_2O_3$ and ZnO and the content of ZnO is preferably in a range about 15-20 atomic %.

Nitrogen, which can prevent the formation of metal oxides on the exposed portions of the drain electrodes 175, the gate lines 121, and the data lines 171 through the contact holes 181, 182 and 183, is preferably used for a pre-heating process before the deposition of the ITO film or the IZO film.

As described above, the second passivation layer 802 covers the edges of the color filters 230R, 230G and 230B such that the color filters 230R, 230G and 230B are prevented from being damaged by following processes and from contaminating overlying layers and the LC layer 3. However, the second passivation layer 802 is not disposed on most portions of the pixel electrodes 190 such that it does not decrease the light transmittance of the LCD.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of manufacturing a thin film transistor array panel, the method comprising:
    forming a plurality of gate lines on a substrate;
    forming a first insulating layer on the gate lines;
    forming a semiconductor layer on the first insulating layer;
    forming a plurality of data lines and drain electrodes operatively coupled at least to the semiconductor layer;
    forming a plurality of color filters, including at least two of different color pigmentations;
    forming a second insulating layer at least on edges of the color filters and causing the second insulating layer to have opening portions corresponding to inner parts of the color filters, where said opening portions pass a substantial amount of light passed through the corresponding color filters, the second insulating layer being disposed opposite the data lines; and
    forming a plurality of pixel electrodes on the color filters such that the pixel electrodes and the second insulating layer cover an entire surface of the color filters.

2. The method of claim 1, further comprising: forming a third insulating layer on the data lines and the drain electrodes.

3. The method of claim 1, wherein the second insulating layer comprises a plurality of portions disposed opposite the gate lines.

4. The method of claim 2, forming a contact hole by patterning the third insulating layer, wherein the contact hole connects between the drain electrodes and the pixel electrodes.

5. A method of manufacturing a thin film transistor array panel, the method comprising:
    forming a plurality of gate lines on a substrate;
    forming a first insulating layer on the gate lines;
    forming a semiconductor layer on the first insulating layer;
    forming a plurality of data lines and drain electrodes operatively coupled at least to the semiconductor layer;
    forming a plurality of color filters, including at least two of different color pigmentations;
    forming a second insulating layer on edges of the color filters, the second insulating layer disposed opposite the data lines and the second insulating layer having drain contact openings defined therethrough which drain contact openings each align with a central inner area portion of a corresponding one of the color filters; and
    forming a plurality of pixel electrodes on the color filters and connecting through the drain contact openings such that the pixel electrodes and the second insulating layer cover an entire surface of the color filters.

6. The method of claim 5, further comprising:
    forming a third insulating layer on the data lines and the drain electrodes.

7. The method of claim 6, wherein the second insulating layer comprises a plurality of portions disposed opposite the gate lines.

8. The method of claim 6, forming a contact hole by patterning the third insulating layer, wherein the contact hole connects between the drain electrodes and the pixel electrodes.

9. A method of manufacturing a thin film transistor array panel, the method comprising:
    forming a plurality of gate lines on a substrate;
    forming a first insulating layer on the gate lines;
    forming a semiconductor layer on the first insulating layer;
    forming a plurality of data lines and drain electrodes operatively coupled at least to the semiconductor layer;
    forming a plurality of color filters, including at least two of different color pigmentations;
    forming a second insulating layer on edges of the color filters, wherein the second insulating layer have opening portions corresponding to inner parts of the color filters and are disposed opposite the data lines, where said opening portions pass a substantial amount of light passed through the corresponding color filters; and
    forming a plurality of pixel electrodes on the color filters, wherein the pixel electrodes contact to the color filters through the opening.

10. The method of claim 9, further comprising: forming a third insulating layer on the data lines and the drain electrodes.

11. The method of claim 10, forming a contact hole by patterning the third insulating layer, wherein the contact hole connects between the drain electrodes and the pixel electrodes.

12. The method of claim 9, wherein the second insulating layer comprises a plurality of portions disposed opposite the gate lines.

* * * * *